United States Patent
Wang et al.

(10) Patent No.: US 10,665,191 B2
(45) Date of Patent: May 26, 2020

(54) SHIFT REGISTER AND DRIVING METHOD THEREFOR, AND DISPLAY DEVICE

(71) Applicants: BOE TECHNOLOGY GROUP CO., LTD., Beijing (CN); BEIJING BOE DISPLAY TECHNOLOGY CO., LTD., Beijing (CN)

(72) Inventors: Guangxing Wang, Beijing (CN); Bin Zhang, Beijing (CN); Dianzheng Dong, Beijing (CN); Qiang Zhang, Beijing (CN); Pengming Chen, Beijing (CN); Kan Zhang, Beijing (CN); Yu Xie, Beijing (CN); Zheng Wang, Beijing (CN)

(73) Assignees: BOE TECHNOLOGY GROUP CO., LTD., Beijing (CN); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 328 days.

(21) Appl. No.: 15/750,679

(22) PCT Filed: Jun. 27, 2017

(86) PCT No.: PCT/CN2017/090262
§ 371 (c)(1),
(2) Date: Feb. 6, 2018

(87) PCT Pub. No.: WO2018/076741
PCT Pub. Date: May 3, 2018

(65) Prior Publication Data
US 2020/0090610 A1     Mar. 19, 2020

(30) Foreign Application Priority Data

Oct. 26, 2016 (CN) .......................... 2016 1 0947335

(51) Int. Cl.
G09G 3/36 (2006.01)

(52) U.S. Cl.
CPC ... *G09G 3/3677* (2013.01); *G09G 2300/0426* (2013.01); *G09G 2310/0286* (2013.01); *G09G 2310/08* (2013.01); *G09G 2320/04* (2013.01)

(58) Field of Classification Search
CPC .. G09G 3/3225; G09G 3/3266; G09G 3/3611; G09G 3/3648;
(Continued)

(56) References Cited

U.S. PATENT DOCUMENTS

2013/0038587 A1* 2/2013 Song .................. G09G 5/18
345/211
2014/0056399 A1 2/2014 Shang
(Continued)

FOREIGN PATENT DOCUMENTS

CN      101093647 A    12/2007
CN      102654969 A     9/2012
(Continued)

OTHER PUBLICATIONS

The International Search Report and Written Opinion dated Sep. 29, 2017; PCT/CN2017/090262.
(Continued)

*Primary Examiner* — Nathan Danielsen

(57) ABSTRACT

A shift register and driving method therefore, and a display device are provided. The shift register includes: an input circuit; an output circuit; a reset circuit; a pull-down circuit; a pull-down control circuit; and a first noise reduction circuit. The first noise reduction circuit is coupled to a second input terminal of the shift register, a first input terminal, an output terminal and a first supply voltage terminal. The shift register can effectively reduce noise at the output terminal.

17 Claims, 3 Drawing Sheets

(58) Field of Classification Search
CPC .......... G09G 3/3674–3681; G09G 2300/0421;
G09G 2300/0426; G09G 2310/0264;
G09G 2310/0267; G09G 2310/0286;
G09G 2310/08; G09G 2320/0209; G09G
2320/04; G09G 2320/043; G09G
2320/045
See application file for complete search history.

(56) References Cited

U.S. PATENT DOCUMENTS

| | | | | |
|---|---|---|---|---|
| 2014/0064437 A1* | 3/2014 | Qi | ............... | G11C 19/28 377/64 |
| 2014/0119493 A1 | 5/2014 | Yang et al. | | |
| 2014/0168050 A1* | 6/2014 | Gu | ............... | G09G 3/3611 345/100 |
| 2015/0206495 A1* | 7/2015 | Xu | ............... | G09G 3/3677 345/213 |
| 2016/0351156 A1 | 12/2016 | Wu et al. | | |

FOREIGN PATENT DOCUMENTS

| | | |
|---|---|---|
| CN | 102915698 A | 2/2013 |
| CN | 102945650 A | 2/2013 |
| CN | 104103244 A | 10/2014 |
| CN | 104318909 A | 1/2015 |
| CN | 106448600 A | 2/2017 |
| KR | 1020140127378 A | 11/2014 |

OTHER PUBLICATIONS

The First Chinese Office Action dated Nov. 6, 2017; Appln. No. 201610947335.3.

* cited by examiner

US 10,665,191 B2

SHIFT REGISTER AND DRIVING METHOD THEREFOR, AND DISPLAY DEVICE

TECHNICAL FIELD

Embodiments of the present disclosure relate to a shift register and a driving method therefore, and a display device.

BACKGROUND

Thin film transistor liquid crystal displays (TFT-LCDs) have been widely used in various fields of production and life, and display by using a progressive scanning method for the matrix of M*N pixels. When displaying, a TFT-LCD drives each pixel in a display panel to display by a driving circuit. The driving circuit of the TFT-LCD mainly comprises a gate driving circuit and a data driving circuit. The data driving circuit is configured to sequentially latch input data according to the timing of a clock signal, convert the latched data into analog signals, and then input the analog signals to data lines of the display panel. The gate driving circuit is usually implemented with shift registers, and the shift registers convert a clock signal into on/off voltages and respectively outputs the voltages to each gate line of the display panel. A gate line on the display panel usually is coupled with a shift register (i.e., one stage of the shift registers). By enabling the shift registers to output turn-on voltages in turn, the progressive scanning for the pixels in the display panel is realized.

On the other hand, with the development of flat panel display, high resolution and narrow bezel have become a trend of development. In response to this trend, Gate Driver on Array (GOA) technology appears. The GOA technology directly integrates the gate driving circuit of the TFT-LCD on the array substrate, thereby replacing a driving chip bonded on the outer edge of the panel and made of a silicon chip. Because the technology can prepare the driving circuit directly on the array substrate, there is no need to bond an IC chip and preparing wirings around the panel, thereby reducing fabrication processes for the panel, reducing production cost, improving the integration level of the TFT-LCD panel, and allowing the panel to realize the design of narrow bezel and high resolution.

SUMMARY

At least one embodiment of the present disclosure provides a shift register and driving method therefore. By adding an input terminal and two P-type transistors to reduce noise at an output terminal and improve the stability of operation, the service life of the TFT-LCD with the shift register is extended.

According to an aspect of the present disclosure, a shift register is disclosed, comprising:

an input unit, a first terminal of the input unit being coupled to a first input terminal of the shift register and configured to receive a first input signal from the first input terminal, a second terminal being coupled to a pull-up node, and a third terminal being coupled to a first clock signal terminal;

an output unit, a first terminal of the output unit being coupled to a second clock signal terminal, a second terminal being coupled to the pull-up node, and a third terminal being coupled to an output terminal of the shift register;

a reset unit, a first terminal of the reset unit being coupled to a reset signal terminal, a second terminal being coupled to the pull-up node, a third terminal being coupled to a first supply voltage terminal, and a fourth terminal being coupled to the output terminal of the shift register;

a pull-down unit, a first terminal of the pull-down unit being coupled to a pull-down node, a second terminal being coupled to the output terminal of the shift register, a third terminal being coupled to the pull-up node, and a fourth terminal being coupled to the first supply voltage terminal;

a pull-down control unit, a first terminal of the pull-down control unit being coupled to the first clock signal terminal, a second terminal being coupled to the second clock signal terminal, a third terminal being coupled to the pull-down node, a fourth terminal being coupled to the first supply voltage terminal, and a fifth terminal being coupled to the pull-up node; and a first noise reduction unit, a first terminal of the first noise reduction unit being coupled to a second input terminal of the shift register and configured to receive a second input signal from the second input terminal, a second terminal being coupled to the first input terminal of the shift register and configured to receive the first input signal from the first input terminal, a third terminal being coupled to the output terminal of the shift register, a fourth terminal being coupled to the first supply voltage terminal, and the first noise reduction unit being configured to continuously reduce noise at the output terminal of the shift register when there is no input signal.

Another embodiment of the present disclosure provides a driving method for a shift register, the shift register comprising an input unit, an output unit, a reset unit, a pull-down unit, a pull-down control unit, and a first noise reduction unit, the method comprising:

transmitting a received input signal to a pull-up node by the input unit;

outputting a second clock signal of a second clock signal terminal to an output terminal of the shift register by the output unit;

resetting a pull-up signal of the pull-up node to a supply voltage of a first supply voltage terminal and resetting an output signal of the output terminal of the shift register to the supply voltage of the first supply voltage terminal by the reset unit;

controlling the pull-down unit to operate or not by the pull-down control unit;

pulling down both the output signal of the output terminal of the shift register and the pull-up signal of the pull-up node to the supply voltage of the first supply voltage terminal by the pull-down unit; and during no input signal continuously reducing noise at the output terminal of the shift register by the first noise reduction unit.

Another embodiment of the present disclosure provides a display device, comprising the shift register described above.

In the shift register according to at least one embodiment of the present disclosure, an input terminal and two P-type transistors are added to reduce noise at an output terminal due to voltage abnormity at the pull-up node, thereby extending the service life of the TFT-LCD with the shift register.

BRIEF DESCRIPTION OF THE DRAWINGS

In order to clearly illustrate the technical solution of the embodiments of the disclosure, the drawings of the embodiments will be briefly described in the following. It is obvious

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. Also, the terms such as "a," "an," etc., are not intended to limit the amount, but indicate the existence of at least one. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", "coupled", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

Transistors used in all the embodiments of the present disclosure may be thin film transistors or field effect transistors or other devices with the same characteristics. In the embodiments, the connections of a drain electrode and a source electrode of each transistor are interchangeable. Therefore, the drain electrode and the source electrode of each transistor in the embodiments of the present disclosure are actually no physical difference. Here, only for the purpose to distinguish these two electrodes of the transistor except a gate electrode, one of them is called the drain electrode, and another is called the source electrode.

There occurs noise at an output terminal in the traditional GOA circuit. At least one embodiment of the present disclosure utilizes a P-type TFT unit to realize a GOA, which can reduce the related defects of the GOA circuit, improve the stability of the GOA circuit, and eliminate residual charges of a capacitor in the GOA circuit.

Figure 1:
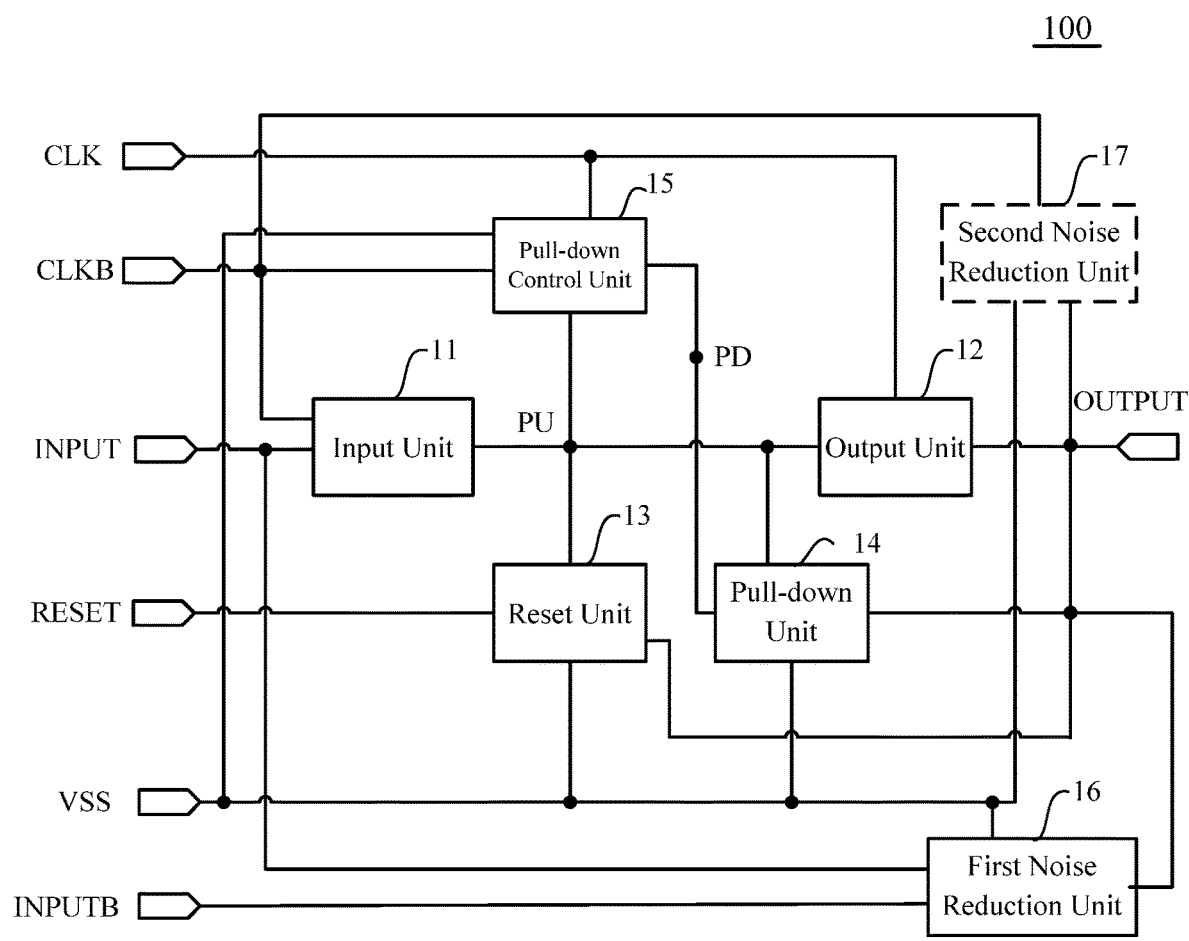
FIG. 1 illustrates a block diagram of a shift register according to an embodiment of the present disclosure.

FIG. 1 illustrates a block diagram of a shift register according to an embodiment of the present disclosure. As illustrated in FIG. 1, in an embodiment, the shift register 100 comprises an input unit 11, an output unit 12, a reset unit 13, a pull-down unit 14, a pull-down control unit 15, and a first noise reduction unit 16.

A first terminal of the input unit 11 is coupled to a first input terminal INPUT of the shift register and configured to receive a first input signal from the first input terminal INPUT, a second terminal of the input unit is coupled to a pull-up node PU, and a third terminal of the input unit is coupled to a first clock signal terminal CLKB. The input unit 11 is configured to transmit the received first input signal to the pull-up node PU upon the first input signal of the first input terminal INPUT being at a valid input level or a first clock signal of the first clock signal terminal CLKB being at a valid control level.

A first terminal of the output unit 12 is coupled to a second clock signal terminal CLK, a second terminal of the output unit is coupled to the pull-up node PU, and a third terminal of the output unit is coupled to an output terminal OUTPUT of the shift register. The output unit 12 is configured to output a second clock signal of the second clock signal terminal CLK to the output terminal OUTPUT upon a pull-up signal at the pull-up node PU being at a valid pull-up level.

A first terminal of the reset unit 13 is coupled to a reset signal terminal RESET, a second terminal of the reset unit is coupled to the pull-up node PU, a third terminal of the reset unit is coupled to a first supply voltage terminal VSS, and a fourth terminal of the reset unit is coupled to the output terminal OUTPUT of the shift register. The reset unit 13 is configured to reset the pull-up signal at the pull-up node PU to a supply voltage of the first supply voltage terminal VSS and to reset an output signal of the output terminal OUTPUT to the supply voltage of the first supply voltage terminal VSS upon a reset signal of the reset signal terminal RESET being at a valid control level.

A first terminal of the pull-down unit 14 is coupled to a pull-down node PD, a second terminal of the pull-down unit is coupled to the output terminal OUTPUT of the shift register, a third terminal of the pull-down unit is coupled to the pull-up node PU, and a fourth terminal of the pull-down unit is coupled to the first supply voltage terminal VSS. The pull-down unit 14 is configured to pull down both the output terminal OUTPUT and the pull-up node PU to the supply voltage of the first supply voltage terminal VSS upon a pull-down signal at the pull-down node PD being at a valid pull-down level.

A first terminal of the pull-down control unit 15 is coupled to the first clock signal terminal CLKB, a second terminal of the pull-down control unit is coupled to the second clock signal terminal CLK, a third terminal of the pull-down control unit is coupled to the pull-down node PD, a fourth terminal of the pull-down control unit is coupled to the first supply voltage terminal VSS, and a fifth terminal of the pull-down control unit is coupled to the pull-up node PU. The pull-down control unit 15 is configured to control the pull-down unit 14 to operate or not. For example, the pull-down control unit 15 generates a pull-down signal with an invalid pull-down level at the pull-down node PD upon the pull-up signal at the pull-up node PU being at a valid pull-up level or the first clock signal of the first clock signal terminal CLKB being at a valid control level, and generates a pull-down signal with a valid pull-down level at the pull-down node PD upon the pull-up signal at the pull-up node PU being at an invalid pull-up level and the second clock signal of the second clock signal terminal CLK being at a valid control level.

A first terminal of the first noise reduction unit 16 is coupled to a second input terminal INPUTB of the shift register and configured to receive a second input signal from the second input terminal INPUTB, a second terminal of the first noise reduction unit is coupled to the first input terminal INPUT of the shift register and configured to receive the first input signal from the first input terminal INPUT, a third terminal of the first noise reduction unit is coupled to the output terminal OUTPUT of the shift register, and a fourth terminal of the first noise reduction unit is coupled to the first supply voltage terminal VSS. The noise reduction unit 16 is configured to continuously reduce noise at the output terminal of the shift register when there is no input signal.

The first clock signal of the first clock signal terminal CLKB and the second clock signal of the second clock signal terminal CLK are opposite to each other in phase.

The first supply voltage terminal VSS is a low supply voltage terminal.

As illustrated in FIG. 1, in another embodiment, the shift register further comprises a second noise reduction unit 17. A first terminal of the second noise reduction unit 17 is coupled to the first clock signal terminal CLKB, a second terminal of the second noise reduction unit is coupled to the output terminal OUTPUT of the shift register, and a third terminal of the second noise reduction unit is coupled to the first supply voltage terminal VSS. The second noise reduction unit 17 is configured to pull down the output signal of the output terminal OUTPUT of the shift register to the supply voltage of the first supply voltage terminal VSS upon the first clock signal of the first clock signal terminal CLKB being at a valid control level.

Figure 2:
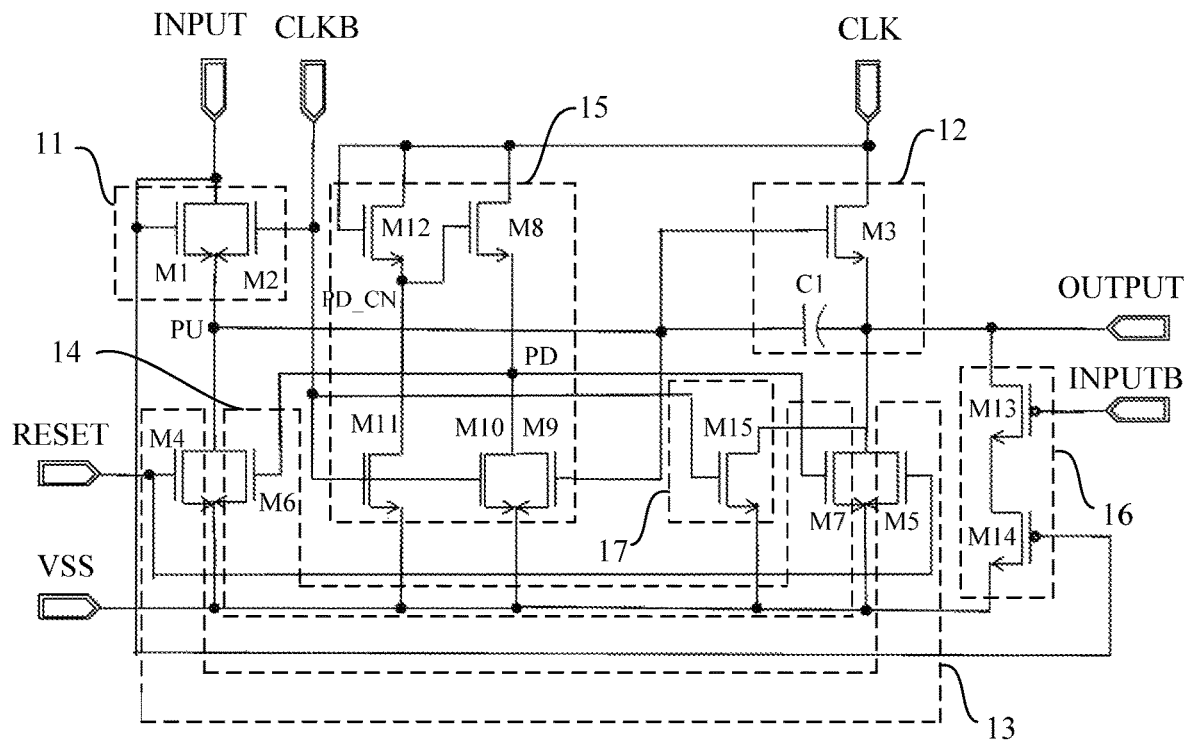
FIG. 2 illustrates a structure diagram of an exemplary circuit of a shift register according to an embodiment of the present disclosure.

FIG. 2 illustrates a structure diagram of an exemplary circuit of a shift register according to an embodiment of the present disclosure. Hereinafter, it is described as an example that a first noise reduction transistor M13 and a second noise reduction transistor M14 in FIG. 2 are P-type transistors and other transistors are N-type transistors. As well known by those skilled in the art, an N-type transistor turns on when the gate electrode thereof is at a high level, and a P-type transistor turns on when the gate electrode thereof is at a low level. In at least one embodiment of the present disclosure, N-type transistors or P-type transistors can be chosen to realize corresponding units or sub-circuits according to needs, and it is not limitative for the embodiments of the present disclosure.

As illustrated in FIG. 2, ill an embodiment, for example, the input unit 11 comprises a first input transistor M1 and a second input transistor M2. A gate electrode and a first electrode of the first input transistor M1 are coupled to the first input terminal INPUT, and a second electrode of the first input transistor is coupled to the pull-up node PU. A gate electrode of the second input transistor M2 is coupled to the first clock signal terminal CLKB, a first electrode of the second input transistor is coupled to the first input terminal INPUT, and a second electrode of the second input transistor is coupled to the pull-up node PU. The first input transistor M1 turns on and transmits the first input signal of the first input terminal INPUT to the pull-up node PU when the first input signal of the first input terminal INPUT is at a high level. Alternatively, the second input transistor M2 turns on and transmits the first input signal of the first input terminal INPUT to the pull-up node PU when the first clock signal of the first clock signal terminal CLKB is at a high level.

In an embodiment, for example, the output unit 12 comprises an output transistor M3 and a first capacitor C1. A gate electrode of the output transistor M3 is coupled to the pull-up node PU, a first electrode of the output transistor is coupled to the second clock signal terminal CLK, and a second electrode of the output transistor is coupled to the output terminal OUTPUT. A first end of the first capacitor C1 is coupled to the pull-up node PU, and a second end of the first capacitor is coupled to the output terminal OUTPUT. The output transistor M3 turns on and outputs the second clock signal of the second clock signal terminal CLK to the output terminal OUTPUT when the pull-up signal at the pull-up node PU is at a high level.

In an embodiment, for example, the reset unit 13 comprises a node reset transistor M4 and an output reset transistor M5. A gate electrode of the node reset transistor M4 is coupled to the reset signal terminal RESET, a first electrode of the node reset transistor is coupled to the pull-up node PU, and a second electrode of the node reset transistor is coupled to the first supply voltage terminal VSS. A gate electrode of the output reset transistor M5 is coupled to the reset signal terminal RESET, a first electrode of the output reset transistor is coupled to the output terminal OUTPUT, and a second electrode of the output reset transistor is coupled to the first supply voltage terminal VSS. When the reset signal of the reset signal terminal RESET is at a high level, the node reset transistor M4 turns on and resets the pull-up signal at the pull-up node PU to the supply voltage of the first supply voltage terminal VSS, and also the output reset transistor M5 turns on and resets the output signal of the output terminal OUTPUT to the supply voltage of the first supply voltage terminal VSS.

In an embodiment, for example, the pull-down unit 14 comprises a node pull-down transistor M6 and an output pull-down transistor M7. A gate electrode of the node pull-down transistor M6 is coupled to the pull-down node PD, a first electrode of the node pull-down transistor is coupled to the pull-up node PU, and a second electrode of the node pull-down transistor is coupled to the first supply voltage terminal VSS. A gate electrode of the output pull-down transistor M7 is coupled to the pull-down node PD, a first electrode of the output pull-down transistor is coupled to the output terminal OUTPUT, and a second electrode of the output pull-down transistor is coupled to the first supply voltage terminal VSS. When the pull-down signal at the pull-down node PD is at a high level, the node pull-down transistor M6 and the output pull-down transistor M7 turn on and respectively pull down the output signal of the output terminal OUTPUT of the shift register and the pull-up signal at the pull-up node PU to the supply voltage of the first supply voltage terminal VSS.

In an embodiment, for example, the pull-down control unit 15 comprises a first pull-down control transistor M8, a second pull-down control transistor M9, a third pull-down control transistor M10, a fourth pull-down control transistor M11 and a fifth pull-down control transistor M12. Of the first pull-down control transistor M8, a gate electrode is coupled to a pull-down control node PD_CN, a first electrode is coupled to the second clock signal terminal CLK, and a second electrode is coupled to the pull-down node PD. Of the second pull-down control transistor M9, a gate electrode is coupled to the pull-up node PU, a first electrode is coupled to the pull-down node PD, and a second electrode is coupled to the first supply voltage terminal VSS. Of the third pull-down control transistor M10, a gate electrode is coupled to the first clock signal terminal CLKB, a first electrode is coupled to the pull-down node PD, and a second electrode is coupled to the first supply voltage terminal VSS. Of the fourth pull-down control transistor M11, a gate electrode is coupled to the first clock signal terminal CLKB, a first electrode is coupled to the pull-down control node PD_CN, and a second electrode is coupled to the first supply voltage terminal VSS. Of the fifth pull-down control transistor M12, a gate electrode and a first electrode are coupled to the second clock signal terminal CLK, and a second electrode is coupled to the pull-down control node PD_CN. For example, the second pull-down control transistor M9 turns on when the pull-up signal PU at the pull-up node PU is at a high level, or the third pull-down control transistor M10 turns on when the first clock signal of the first clock signal terminal CLKB is at a high level; therefore, the pull-down signal with a low level is generated at the pull-down node PD, and the node pull-down transistor M6 and the output pull-down transistor M7 do not turn on. When the pull-up signal at the pull-up node PU is at a low level and the second clock signal at the second clock signal terminal CLK is at a high level, the pull-down signal with a high level is generated at the pull-down node PD, and the node pull-down transistor M6 and the output pull-down transistor M7 turn on.

In an embodiment, for example, the first noise reduction unit 16 comprises the first noise reduction transistor M13 and the second noise reduction transistor M14. Of the first noise reduction transistor M13, a gate electrode is coupled to the second input terminal INPUTB, and a first electrode is coupled to the output terminal OUTPUT. Of the second noise reduction transistor M14, a gate electrode is coupled to the first input terminal INPUT, a first electrode is coupled to a second electrode of the first noise reduction transistor M13, and a second electrode is coupled to the first supply voltage terminal VSS. Because both the first noise reduction transistor M13 and the second noise reduction transistor M14 are P-type transistors, both the first noise reduction transistor M13 and the second noise reduction transistor M14 turn on when there is no input signal at both the first input terminal INPUT and the second input terminal INPUTB. In this way, the output signal of the output terminal OUTPUT of the shift register is continuously pulled down to the supply voltage of the first supply voltage terminal VSS, thereby reducing an influence of the residual charges in the first capacitor C1 on the voltages of the pull-up node PU and the output terminal OUTPUT, and reducing the noise at the output terminal OUTPUT.

When any one of the first input terminal INPUT and the second input terminal INPUTB inputs an input signal with a high level, the pull-up signal at the pull-up node PU should be at a high level, and the first noise reduction transistor M13 and/or the second noise reduction transistor M14 turns off. When both the first input terminal INPUT and the second input terminal INPUTB input input signals with low levels, the pull-up signal at the pull-up node PU should be at a low level, and the first noise reduction transistor M13 and the second noise reduction transistor M14 turn on, so as to eliminate the influence of the residual charges in the first capacitor C1 on the voltages of the pull-up node PU and the output terminal OUTPUT, and to reduce the noise at the output terminal OUTPUT and improve the stability of the GOA unit.

In the shift register according to at least one embodiment of the present disclosure, an input terminal INPUTB and two P-type transistors are added to reduce noise at the output terminal which occurs due to the voltage abnormality at the pull-up node PU, thereby extending the service life of the TFT-LCD employing the shift register.

In another embodiment, for example, the shift register further comprises a second noise reduction unit 17. The second noise reduction unit 17 comprises a third noise reduction transistor M15. Of the third noise reduction transistor M15, a gate electrode is coupled to the first clock signal terminal CLKB, a first electrode is coupled to the output terminal OUTPUT, and a second electrode is coupled to the first supply voltage terminal VSS. When the first clock signal at the first clock signal terminal CLKB is at a high level, the third noise reduction transistor M15 turns on and pulls down the output signal of the output terminal OUTPUT of the shift register to the supply voltage of the first supply voltage terminal VSS, so as to reduce the noise at the output terminal.

Figure 3:
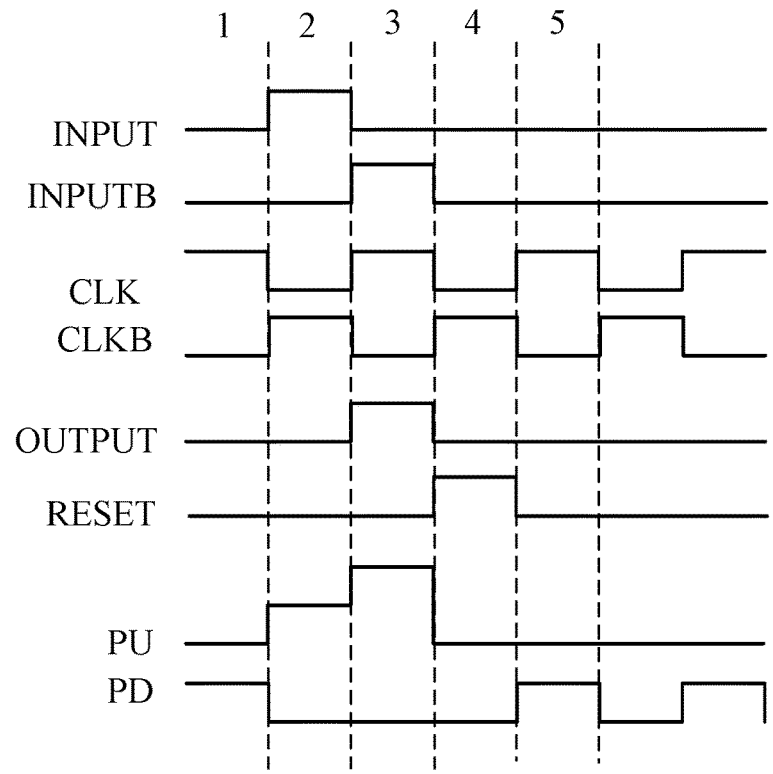
FIG. 3 illustrates an operational timing diagram of the exemplary circuit of the shift register in FIG. 2.

FIG. 3 illustrates an operational timing diagram of the exemplary circuit of the shift register in FIG. 2. A driving method for the shift register in FIG. 2 is described below with reference to FIG. 2 and FIG. 3.

In a first phase 1 (no input phase), the first input signal of the first input terminal INPUT, the second input signal of the second input terminal INPUTB and the first clock signal at the first clock signal terminal CLKB are all at low levels. Both the first input transistor M1 and the second input transistor M2 turn off. Although the second clock signal at the second clock signal terminal CLK is at a high level, because the pull-up signal at the pull-up node PU is at a low level, the output transistor M3 turns off, and the output terminal OUTPUT outputs a low level. Both the first noise reduction transistor M13 and the second noise reduction transistor M14 turn on and pull down the output signal of the output terminal OUTPUT to the supply voltage of the first supply voltage terminal VSS.

In a second phase 2 (input phase), both the first input signal of the first input terminal INPUT and the first clock signal at the first clock signal terminal CLKB are at high levels, and both the second input signal of the second input terminal INPUTB and the second clock signal at the second clock signal terminal CLK are at low levels. The first input transistor M1 and the second input transistor M2 turn on and transmit the high level of the first input terminal INPUT to the pull-up node PU. At this time, the pull-up node PU is at a first high voltage so that the output transistor M3 turns on. Because the second clock signal of the second clock signal terminal CLK is at a low level, the output terminal OUTPUT outputs a low level. The first noise reduction transistor M13 turns on, the second noise reduction transistor M14 turns off, and the first supply voltage terminal VSS does not affect the output signal of the output terminal OUTPUT.

In a third phase 3 (output phase), both the first input signal of the first input terminal INPUT and the first clock signal of the first clock signal terminal CLKB are at low levels, and both the second input signal of the second input terminal INPUTB and the second clock signal at the second clock signal terminal CLK are at high levels. The first input transistor M1 and the second input transistor M2 turn off, the reset signal terminal RESET is at a low level, the node reset transistor M4 remains to turn off, the pull-up node PU continually enables the output transistor M3 to turn on, the second clock signal of the second clock signal terminal CLK is at a high level, and the output terminal OUTPUT outputs a high level. Due to voltage coupling effect of the first capacitor C1, at this time, the pull-up node PU is lifted from the first high voltage to a second high voltage to further increase charging ability of the output transistor M3 and to ensure charging for pixels. In addition, in this phase, since the pull-up node PU is still at a high level, the second pull-down control transistor M9 remains to turn on, the pull-down node PD is still at a low level, and accordingly both the node pull-down transistor M6 and the output pull-down transistor M7 remain to turn off. The first noise reduction transistor M13 turns off, the second noise reduction transistor M14 turns on, and the first supply voltage terminal VSS does not affect the output signal of the output terminal OUTPUT.

In a fourth phase 4 (reset phase), the first input signal of the first input terminal INPUT, the second input signal of the second input terminal INPUTB and the second clock signal at the second clock signal terminal CLK are all at low levels, and both the first clock signal at the first clock signal terminal CLKB and the reset signal of the reset signal terminal RESET are at high levels. The input transistor M1 remains to turn off, and the second input transistor M2 turns on and transmits the low level of the first input terminal INPUT to the pull-up node PU. The reset signal of the reset signal terminal RESET is at a high level, and the node reset transistor M4 and the output reset transistor M5 turn on and respectively reset the pull-up signal at the pull-up node PU and the output signal of the output terminal OUTPUT to the supply voltage of the first supply voltage terminal VSS. In addition, in this phase, since the pull-up node PU is at a low level, the second pull-down control transistor M9 turns off. Because the first clock signal of the first clock signal terminal CLKB is at a high level, the third pull-down control transistor M10 turns on so that the pull-down node PD is still at a low level, and both the node pull-down transistor M6 and the output pull-down transistor M7 remain to turn off. The third noise reduction transistor M15 turns on and pulls down the output signal of the output terminal OUTPUT of the shift register to the supply voltage of the first supply voltage terminal VSS, so as to reduce the noise at the output terminal. Both the first noise reduction transistor M13 and the second noise reduction transistor M14 turn on and pull down the output signal of the output terminal OUTPUT to the supply voltage of the first supply voltage terminal VSS, so as to reduce the noise at the output terminal.

In a fifth phase 5 (maintenance phase), the first input signal of the first input terminal INPUT, the second input signal of the second input terminal INPUTB and the first clock signal at the first clock signal terminal CLKB are all at low levels, and the second clock signal at the second clock signal terminal CLK is at a high level. The third pull-down control transistor M10, the fourth pull-down control transistor M11 and the third noise reduction transistor M15 turn off. Because the pull-up node PU is at a low level, the second pull-down control transistor M9 turns off. Because the second clock signal at the second clock signal terminal CLK is at a high level, both the first pull-down control transistor M8 and the fifth pull-down control transistor M12 turn on so that the pull-down node PD is at a high level, and both the node pull-down transistor M6 and the output pull-down transistor M7 turn on and pull down the output signal of the output terminal OUTPUT of the shift register and the pull-up signal at the pull-up node PU to the supply voltage of the first supply voltage terminal VSS. Both the first noise reduction transistor M13 and the second noise reduction transistor M14 remain to turn on, reducing the noise at the output terminal.

After that, the first clock signal at the first clock signal terminal CLKB is at a high level, the third pull-down control transistor M10 turns on so that the pull-down node PD is at a low level, and both the node pull-down transistor M6 and the output pull-down transistor M7 turn off. The third noise reduction transistor M15 turns on, reducing the noise at the output terminal. Both the first noise reduction transistor M13 and the second noise reduction transistor M14 remain to turn on, reducing the noise at the output terminal.

After that, before the arrival of a next frame, the pull-up node PU is always at a low level, the level at the pull-down node PD alternates between a high level and a low level, and both the first noise reduction transistor M13 and the second noise reduction transistor M14 remain to turn on, continuously reducing the noise at the output terminal OUTPUT. After the shift register receives a high level signal of the first input terminal INPUT until the next frame arrives, the second phase described above is re-executed.

The first supply voltage terminal VSS is a low supply voltage terminal.

As can be seen from FIG. 3, the first clock signal of the first clock signal terminal CLKB and the second clock signal of the second clock signal terminal CLK are opposite to each other in phase.

At least one embodiment of the present disclosure also provides a driving method for the above shift register. The method is described below with reference to FIG. 2 and FIG. 3. In an embodiment, for example, as illustrated in FIG. 2, the shift register 100 comprises the input unit 11, the output unit 12, the reset unit 13, the pull-down unit 14, the pull-down control unit 15, and the first noise reduction unit 16. The method comprises the following operations.

The received input signal is transmitted to the pull-up node PU by the input unit 11; the second clock signal of the second clock signal terminal CLK is output to the output terminal OUTPUT of the shift register by the output unit 12; the pull-up signal of the pull-up node PU is reset to the supply voltage of the first supply voltage terminal VSS and the output signal of the output terminal OUTPUT of the shift register is reset to the supply voltage of the first supply voltage terminal VSS by the reset unit 13; whether or not the pull-down unit 14 operates is controlled by the pull-down control unit 15; both the output signal of the output terminal OUTPUT of the shift register and the pull-up signal of the pull-up node PU are pulled down to the supply voltage of the first supply voltage terminal VSS by the pull-down unit 14; and during no input signal, the noise at the output terminal OUTPUT of the shift register is continuously reduced by the first noise reduction unit 16.

In an embodiment, the shift register 100 further comprises the second noise reduction unit 17, and the method further comprises pulling down the output signal of the output terminal OUTPUT of the shift register to the supply voltage of the first supply voltage terminal VSS by the second noise reduction unit 17. The first supply voltage terminal VSS here is a low supply voltage terminal.

In the shift register and driving method therefore according to embodiments of the present disclosure, an input terminal and two P-type transistors are added to reduce the noise at the output terminal occurring due to the voltage abnormity at the pull-up node, thereby extending the service life of the TFT-LCD with the shift register.

Figure 4:
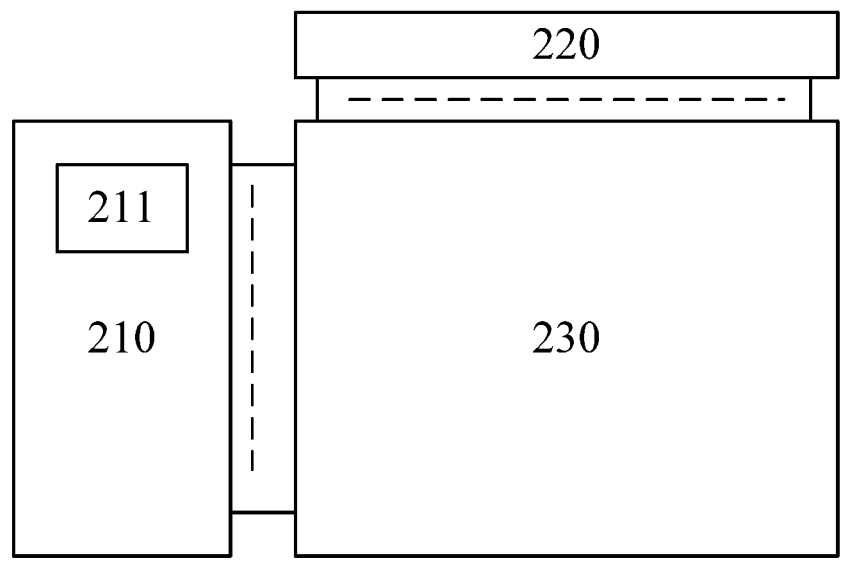
FIG. 4 illustrates a display device according to an embodiment of the present disclosure.

At least one embodiment of the present disclosure also provides a display device comprising the above shift register. FIG. 4 illustrates a schematic diagram of the display device. The display device 200 comprises a gate driver 210, a data driver 220, and a display panel 230. The gate driver 210 and the data driver 220 are respectively coupled in signal to the display panel 230 through gate lines and data lines. The gate driver 210 comprises at least one shift register 211, and the shift register 211 may be the shift register according to any one of the above embodiments. The display panel 230 may be a liquid crystal display panel, an organic light-emitting diode display panel, an electronic paper display panel, etc., and it is not limited by the embodiments of the present disclosure.

The foregoing descriptions are only the specific embodiments of the present disclosure, and the scope of protection of the present disclosure is not limited thereto. Modifications or alternations easily made by anyone skilled in the art within the technical scope disclosed by the present disclosure shall all fall within the scope of protection of the present disclosure. Therefore, the scope of protection of the present disclosure should be defined by the appended claims.

The application claims priority to the Chinese patent application No. 201610947335.3, filed on Oct. 26, 2016, the entire disclosure of which is incorporated herein by reference as part of the present application.

What is claimed is:

1. A shift register, comprising:
an input circuit, a first terminal of the input circuit being coupled to a first input terminal of the shift register and configured to receive a first input signal from the first input terminal, a second terminal of the input circuit being coupled to a pull-up node, and a third terminal of the input circuit being coupled to a first clock signal terminal;
an output circuit, a first terminal of the output circuit being coupled to a second clock signal terminal, a second terminal of the output circuit being coupled to the pull-up node, and a third terminal of the output circuit being coupled to an output terminal of the shift register;
a pull-down circuit, a first terminal of the pull-down circuit being coupled to a pull-down node, a second terminal of the pull-down circuit being coupled to the output terminal of the shift register, a third terminal of the pull-down circuit being coupled to the pull-up node, and a fourth terminal of the pull-down circuit being coupled to a first supply voltage terminal;
a pull-down control circuit, a first terminal of the pull-down control circuit being coupled to the first clock signal terminal, a second terminal of the pull-down control circuit being coupled to the second clock signal terminal, a third terminal of the pull-down control circuit being coupled to the pull-down node, a fourth terminal of the pull-down control circuit being coupled to the first supply voltage terminal, and a fifth terminal of the pull-down control circuit being coupled to the pull-up node; and
a first noise reduction circuit, a first terminal of the first noise reduction circuit being coupled to a second input terminal of the shift register and configured to receive a second input signal from the second input terminal, a second terminal of the first noise reduction circuit being coupled to the first input terminal of the shift register and configured to receive the first input signal from the first input terminal, a third terminal of the first noise reduction circuit being coupled to the output terminal of the shift register, a fourth terminal of the first noise reduction circuit being coupled to the first supply voltage terminal, and the first noise reduction circuit being configured to continuously reduce noise at the output terminal of the shift register when there is no input signal from the first input terminal and the second input terminal.

2. The shift register according to claim 1, further comprising a second noise reduction circuit,
wherein a first terminal of the second noise reduction circuit is coupled to the first clock signal terminal, a second terminal of the second noise reduction circuit is coupled to the output terminal of the shift register, and a third terminal of the second noise reduction circuit is coupled to the first supply voltage terminal.

3. The shift register according to claim 2, wherein the second noise reduction circuit comprises a third noise reduction transistor, a gate electrode of the third noise reduction transistor is coupled to the first clock signal terminal, a first electrode of the third noise reduction transistor is coupled to the output terminal, and a second electrode of the third noise reduction transistor is coupled to the first supply voltage terminal.

4. The shift register according to claim 1, wherein the first noise reduction circuit comprises:
a first noise reduction transistor, a gate electrode of the first noise reduction transistor being coupled to the second input terminal, and a first electrode of the first noise reduction transistor being coupled to the output terminal; and
a second noise reduction transistor, a gate electrode of the second noise reduction transistor being coupled to the first input terminal, a first electrode of the second noise reduction transistor being coupled to a second electrode of the first noise reduction transistor, and a second electrode of the second noise reduction transistor being coupled to the first supply voltage terminal.

5. The shift register according to claim 4, wherein the first noise reduction transistor and the second noise reduction transistor are P-type transistors, and other transistors are all N-type transistors.

6. The shift register according to claim 1, wherein the input circuit comprises:
a first input transistor, a gate electrode and a first electrode of the first input transistor being coupled to the first input terminal, and a second electrode of the first input transistor being coupled to the pull-up node; and
a second input transistor, a gate electrode of the second input transistor being coupled to the first clock signal terminal, a first electrode of the second input transistor being coupled to the first input terminal, and a second electrode of the second input transistor being coupled to the pull-up node.

7. The shift register according to claim 1, wherein the output circuit comprises:
an output transistor, a gate electrode of the output transistor being coupled to the pull-up node, a first electrode of the output transistor being coupled to the second clock signal terminal, and a second electrode of the output transistor being coupled to the output terminal; and
a first capacitor, a first end of the first capacitor being coupled to the pull-up node, and a second end of the first capacitor being coupled to the output terminal.

8. The shift register according to claim 1, wherein the pull-down circuit comprises:
a node pull-down transistor, a gate electrode of the node pull-down transistor being coupled to the pull-down node, a first electrode of the node pull-down transistor being coupled to the pull-up node, and a second electrode of the node pull-down transistor being coupled to the first supply voltage terminal; and
an output pull-down transistor, a gate electrode of the output pull-down transistor being coupled to the pull-down node, a first electrode of the output pull-down transistor being coupled to the output terminal, and a second electrode of the output pull-down transistor being coupled to the first supply voltage terminal.

9. The shift register according to claim 1, wherein the pull-down control circuit comprises:
a first pull-down control transistor, a gate electrode of the first pull-down control transistor being coupled to a pull-down control node, a first electrode of the first pull-down control transistor being coupled to the second clock signal terminal, and a second electrode of the first pull-down control transistor being coupled to the pull-down node;

a second pull-down control transistor, a gate electrode of the second pull-down control transistor being coupled to the pull-up node, a first electrode of the second pull-down control transistor being coupled to the pull-down node, and a second electrode of the second pull-down control transistor being coupled to the first supply voltage terminal;

a third pull-down control transistor, a gate electrode of the third pull-down control transistor being coupled to the first clock signal terminal, a first electrode of the third pull-down control transistor being coupled to the pull-down node, and a second electrode of the third pull-down control transistor being coupled to the first supply voltage terminal;

a fourth pull-down control transistor, a gate electrode of the fourth pull-down control transistor being coupled to the first clock signal terminal, a first electrode of the fourth pull-down control transistor being coupled to the pull-down control node, and a second electrode of the fourth pull-down control transistor being coupled to the first supply voltage terminal; and a fifth pull-down control transistor, a gate electrode and a first electrode of the fifth pull-down control transistor being coupled to the second clock signal terminal, and a second electrode of the fifth pull-down control transistor being coupled to the pull-down control node.

10. The shift register according to claim 1, wherein a second clock signal of the second clock signal terminal and a first clock signal of the first clock signal terminal are opposite to each other in phase.

11. The shift register according to claim 1, wherein the first supply voltage terminal is a low supply voltage terminal.

12. The shift register according to claim 1, further comprising a reset circuit, a first terminal of the reset circuit being coupled to a reset signal terminal, a second terminal of the reset circuit being coupled to the pull-up node, a third terminal of the reset circuit being coupled to a first supply voltage terminal, and a fourth terminal of the reset circuit being coupled to the output terminal of the shift register.

13. The shift register according to claim 12, wherein the reset circuit comprises:

a node reset transistor, a gate electrode of the node reset transistor being coupled to the reset signal terminal, a first electrode of the node reset transistor being coupled to the pull-up node, and a second electrode of the node reset transistor being coupled to the first supply voltage terminal; and an output reset transistor, a gate electrode of the output reset transistor being coupled to the reset signal terminal, a first electrode of the output reset transistor being coupled to the output terminal, and a second electrode of the output reset transistor being coupled to the first supply voltage terminal.

14. A display device, comprising the shift register according to claim 1.

15. A driving method for a shift register, the shift register comprising an input circuit, an output circuit, a reset circuit, a pull-down circuit, a pull-down control circuit, and a first noise reduction circuit, the method comprising:

transmitting a received input signal to a pull-up node by the input circuit;

outputting a second clock signal of a second clock signal terminal to an output terminal of the shift register by the output circuit;

resetting a pull-up signal of the pull-up node to a supply voltage of a first supply voltage terminal and resetting an output signal of the output terminal of the shift register to the supply voltage of the first supply voltage terminal by the reset circuit;

controlling the pull-down circuit to operate or not by the pull-down control circuit;

pulling down both the output signal of the output terminal of the shift register and the pull-up signal of the pull-up node to the supply voltage of the first supply voltage terminal by the pull-down circuit; and during no input signal to the first noise reduction circuit continuously reducing noise at the output terminal of the shift register by the first noise reduction circuit.

16. The driving method according to claim 15, wherein the shift register further comprises a second noise reduction circuit, and the method further comprises:

pulling down the output signal of the output terminal of the shift register to the supply voltage of the first supply voltage terminal by the second noise reduction circuit.

17. The driving method according to claim 15, wherein the first supply voltage terminal is a low supply voltage terminal.

* * * * *